US012581746B2

(12) United States Patent
Ganesan et al.

(10) Patent No.: US 12,581,746 B2
(45) Date of Patent: Mar. 17, 2026

(54) SILICON-CONTROLLED RECTIFIERS FOR ELECTROSTATIC DISCHARGE PROTECTION

(71) Applicant: GlobalFoundries U.S. Inc., Malta, NY (US)

(72) Inventors: Vishal Ganesan, Dresden (DE); Prantik Mahajan, Dresden (DE); Nandha Kumar Subramani, Dresden (DE); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 864 days.

(21) Appl. No.: 17/857,439

(22) Filed: Jul. 5, 2022

(65) Prior Publication Data

US 2024/0014204 A1 Jan. 11, 2024

(51) Int. Cl.
*H10D 89/60* (2025.01)
(52) U.S. Cl.
CPC .................................. *H10D 89/713* (2025.01)
(58) Field of Classification Search
CPC .................................................... H10D 89/713
See application file for complete search history.

(56) References Cited

U.S. PATENT DOCUMENTS 6,850,397 B2 2/2005 Russ et al.
7,786,504 B2 8/2010 Chen et al.
8,952,456 B2 2/2015 Ker et al.
2010/0171149 A1* 7/2010 Denison .............. H10D 18/251
257/173
2018/0301445 A1* 10/2018 Yam ..................... H10D 89/811

FOREIGN PATENT DOCUMENTS

CN 107658295 A 2/2018

OTHER PUBLICATIONS

A modified low voltage triggered silicon controlled rectifier (SCR) for ESD applications; Wenqiang, Song et al.; 2020; Semicond. Sci. Technol.; 35; 055015; DOI 10.1088/1361-6641/ab78f8 (Year: 2020).*

* cited by examiner

*Primary Examiner* — Christine S. Kim
*Assistant Examiner* — Tyler J Wiegand
(74) *Attorney, Agent, or Firm* — Thompson Hine LLP; Francois Pagette

(57) ABSTRACT

Structures for a silicon-controlled rectifier and methods of forming a structure for a silicon-controlled rectifier. The structure comprises a first well and a second well in a semiconductor substrate, a first terminal including a first doped region in the first well, and a second terminal including a second doped region in the second well. The first well, the second well and the first doped region have a first conductivity type, and the second doped region has a second conductivity type opposite to the first conductivity type. The structure further comprises a deep well in the semiconductor substrate. The deep well has the second conductivity type, the first well is positioned in a vertical direction between the deep well and the top surface of the semiconductor substrate, and the second well is positioned in the vertical direction between the deep well and the top surface of the semiconductor substrate.

17 Claims, 5 Drawing Sheets

SILICON-CONTROLLED RECTIFIERS FOR ELECTROSTATIC DISCHARGE PROTECTION

BACKGROUND

The disclosure relates generally to semiconductor devices and integrated circuit fabrication and, more specifically, to structures for a silicon-controlled rectifier and methods of forming a structure for a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed toward the integrated circuit. An ESD event may occur during post-manufacture chip handling or after chip installation on a circuit board or other carrier. An ESD event may originate from a variety of sources, such as the human body, a machine component, or a chip carrier.

Precautions may be taken to protect the integrated circuit from an ESD event. One such precaution is an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

A common type of protection device deployed in an ESD protection circuit is a silicon-controlled rectifier (SCR). In its quiescent high-impedance state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped in its low-impedance state to conduct the forward current so long as the forward current remains above another engineered threshold, known as the holding current. When the forward current from the ESD event drops below the holding current, the SCR returns to its quiescent high-impedance state.

Improved structures for a silicon-controlled rectifier and methods of forming a structure for a silicon-controlled rectifier are needed.

SUMMARY

In an embodiment, a structure for a silicon-controlled rectifier is provided. The structure comprises a first well and a second well in a semiconductor substrate, a first terminal including a first doped region in the first well, and a second terminal including a second doped region in the second well. The first well, the second well and the first doped region have a first conductivity type, and the second doped region has a second conductivity type opposite to the first conductivity type. The structure further comprises a deep well in the semiconductor substrate. The deep well has the second conductivity type, the first well is positioned in a vertical direction between the deep well and the top surface of the semiconductor substrate, and the second well is positioned in the vertical direction between the deep well and the top surface of the semiconductor substrate.

In an embodiment, a method of forming a structure for a silicon-controlled rectifier is provided. The method comprises forming a first well and a second well in a semiconductor substrate, forming a first terminal including a first doped region in the first well, forming a second terminal including a second doped region in the second well, and forming a deep well in the semiconductor substrate. The first well, the second well, and the first doped region have a first conductivity type, and the second doped region has a second conductivity type opposite to the first conductivity type. The deep well has the second conductivity type, the first well is positioned in a vertical direction between the deep well and a top surface of the semiconductor substrate, and the second well positioned in the vertical direction between the deep well and the top surface of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
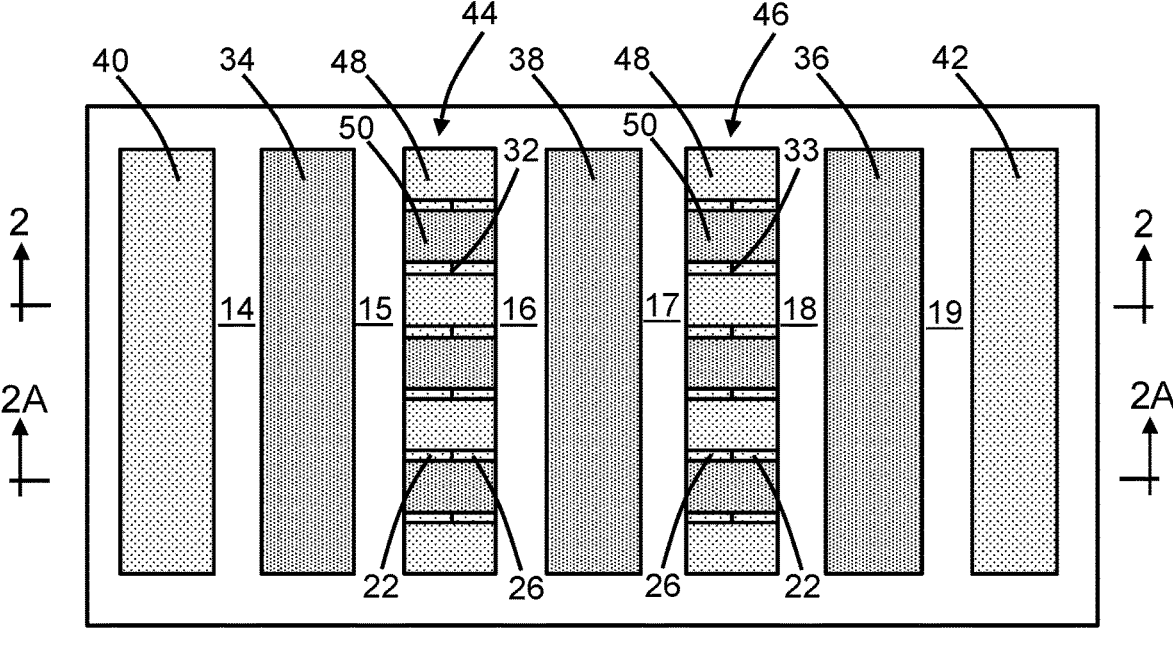
FIG. 1 is a top view of a structure in accordance with embodiments of the invention.
Figure 2:
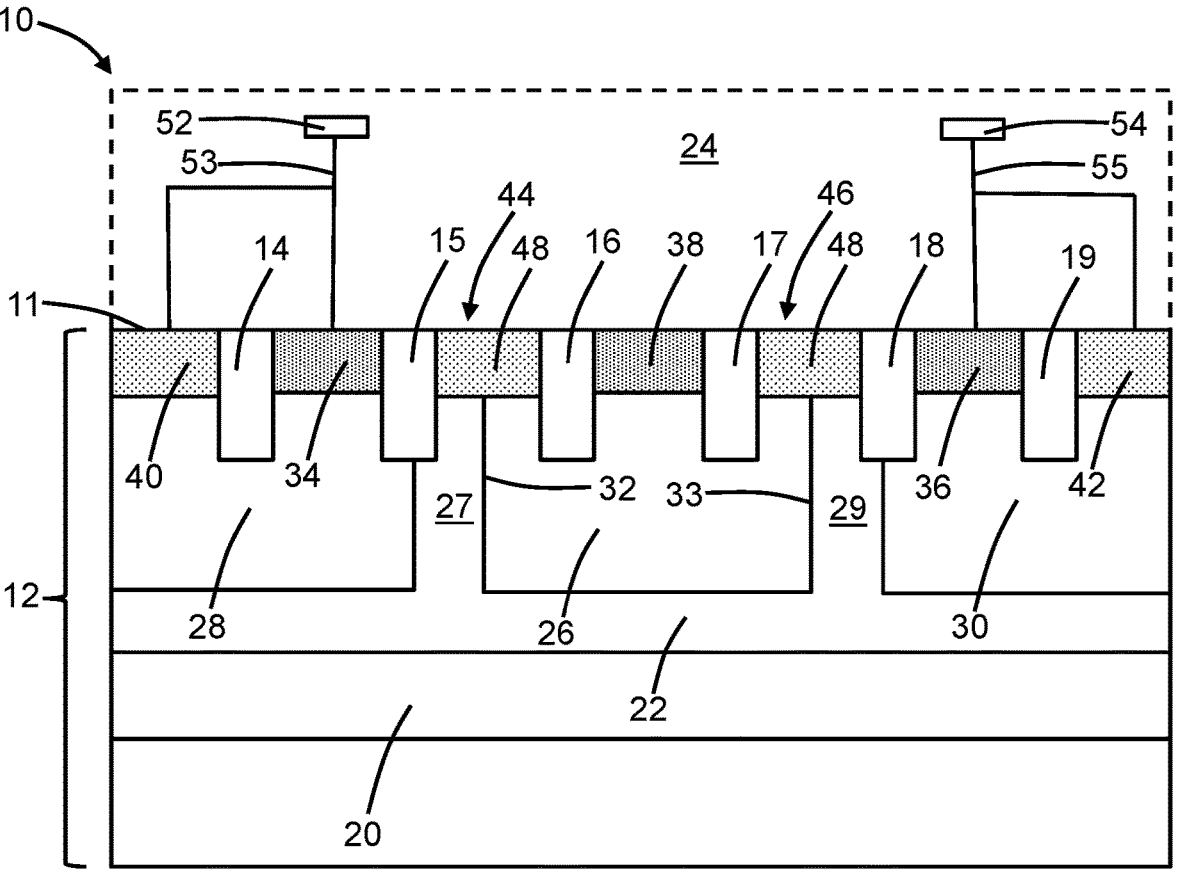
FIG. 2 is a cross-sectional view taken generally along line 2-2 in FIG. 1.
Figure 2A:
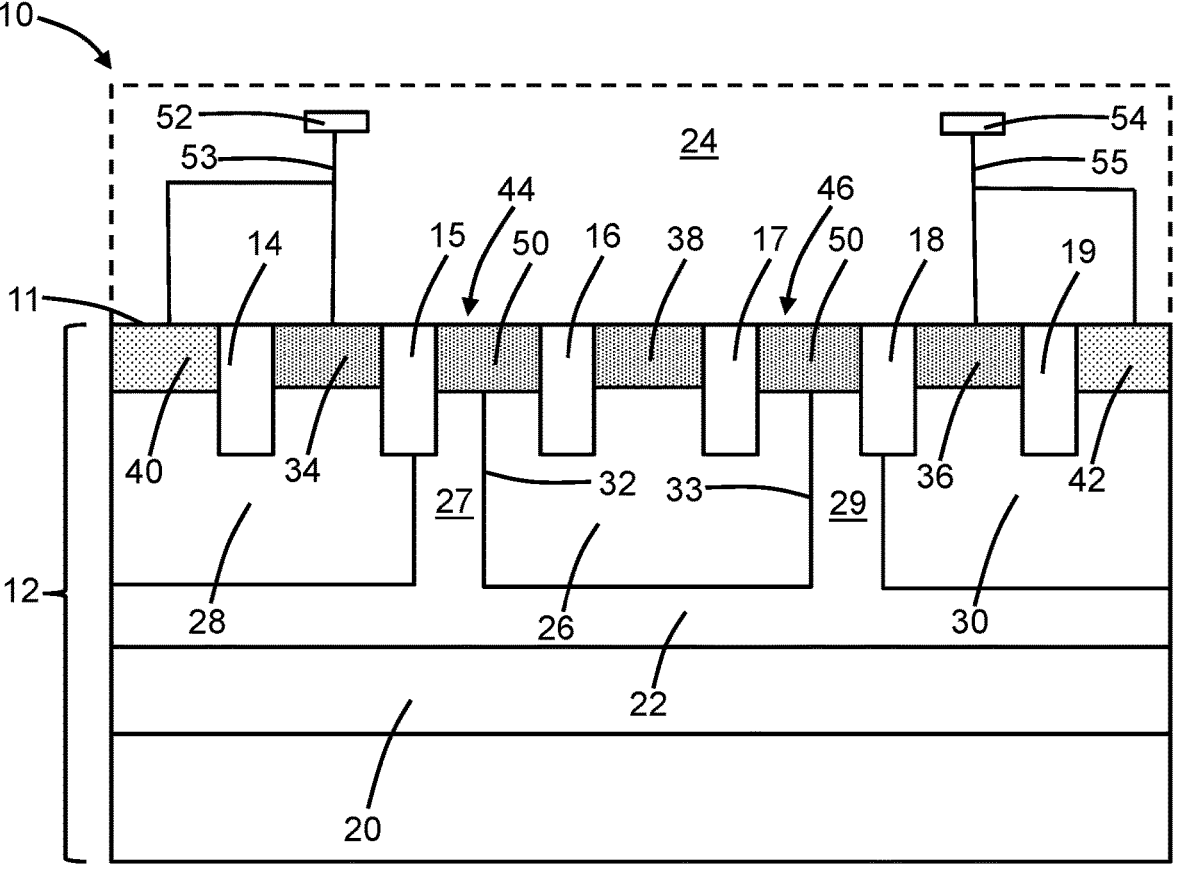
FIG. 2A is a cross-sectional view taken generally along line 2A-2A in FIG. 1.

With reference to FIGS. 1, 2, 2A and in accordance with embodiments of the invention, a structure 10 for a silicon-controlled rectifier includes a semiconductor substrate 12, as well as shallow trench isolation regions 14, 15, shallow trench isolation regions 16, 17, and shallow trench isolation regions 18, 19 that are arranged in the semiconductor substrate 12. The semiconductor substrate 12 may be comprised of a semiconductor material, such as single-crystal silicon, and the semiconductor substrate 12 may be initially doped, before subsequent processing, to have, for example, p-type conductivity. The shallow trench isolation regions 14-19 may be formed by patterning shallow trenches in the semiconductor substrate 12 with lithography and etching processes, depositing a dielectric material, such as silicon dioxide, in the shallow trenches, and planarizing and/or recessing the deposited dielectric material.

A deep well 20 is positioned in the semiconductor substrate 12. The portion of the semiconductor substrate 12 beneath the deep well 20 has an opposite conductivity type from the deep well 20. In an embodiment, the deep well 20 may be doped with a concentration of an n-type dopant (e.g., arsenic or phosphorus) to provide n-type conductivity. The deep well 20 may be formed by introducing a dopant by, for example, ion implantation into the semiconductor substrate 12. The implantation conditions (e.g., ion species, dose, kinetic energy) may be selected to tune the electrical and physical characteristics of the deep well 20. The deep well 20 isolates the silicon-controlled rectifier from the portion of the semiconductor substrate 12 beneath the deep well 20.

A well 22 is positioned in the semiconductor substrate 12 between the deep well 20 and the top surface 11 of the semiconductor substrate 12 in a vertical direction. The well 22, which is doped to have an opposite conductivity type from the deep well 20, adjoins the deep well 20. In an embodiment, the deep well 20 may fully separate the well 22 from the semiconductor substrate 12. The well 22 may be formed by introducing a dopant by, for example, ion implantation into the semiconductor substrate 12. Implantation conditions (e.g., ion species, dose, kinetic energy) may be selected to tune the electrical and physical characteristics of the well 22. In an embodiment, the well 22 may be doped with a concentration of a p-type dopant (e.g., boron) to provide p-type conductivity.

Wells 28, 30 are positioned in the semiconductor substrate 12. The wells 28, 30, which are located inside the well 22, are positioned in a vertical direction between the deep well 20 and the top surface 11 of the semiconductor substrate 12. The wells 28, 30 may be doped to have the same conductivity type as the well 22 but at a higher dopant concentration than the well 22. The shallow trench isolation region 15 overlaps with a side edge of the well 28, and a portion of the well 22 is positioned in a vertical direction between the deep well 20 and the well 28. The shallow trench isolation region 18 overlaps with a side edge of the well 30, and a portion of the well 22 is positioned in a vertical direction between the deep well 20 and the well 30.

The wells 28, 30 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for the implantation of ions. The implantation mask may include a layer of an organic photoresist that is applied and patterned to form openings exposing the selected areas on the top surface 11 of the semiconductor substrate 12 and determining, at least in part, the location and horizontal dimensions of the wells 28, 30. The implantation mask has a thickness and stopping power sufficient to block the implantation of ions in masked areas. The implantation conditions (e.g., ion species, dose, kinetic energy) may be selected to tune the electrical and physical characteristics of the wells 28, 30. In an embodiment, the wells 28, 30 may be doped with a concentration of a p-type dopant (e.g., boron) to provide p-type conductivity. In an embodiment, the wells 28, 30 may be doped with a higher concentration of the p-type dopant than the well 22. In an embodiment, the wells 28, 30 may include a region of higher dopant concentration adjacent to the well 22 and a region of lower dopant concentration between the region of higher dopant concentration and the top surface 11 of the semiconductor substrate 12.

A well 26 is positioned in the semiconductor substrate 12. The well 26, which is located inside the well 22, is positioned in a vertical direction between the deep well 20 and the top surface 11 of the semiconductor substrate 12. The well 26 may be doped to have the same conductivity type as the deep well 20 and an opposite conductivity type from the well 22. A portion of the well 22 is positioned in a vertical direction between the well 26 and the deep well 20. In an embodiment, the well 26 may be doped with a concentration of an n-type dopant (e.g., arsenic or phosphorus) to provide n-type conductivity. In an embodiment, the well 26 may be doped with a lower concentration of the n-type dopant than the deep well 20. In an embodiment, the well 26 may include a region of higher dopant concentration adjacent to the well 22 and a region of lower dopant concentration between the region of higher dopant concentration and the top surface 11 of the semiconductor substrate 12.

The well 26 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 26. The implantation mask has a thickness and stopping power sufficient to block the implantation of ions in masked areas. The implantation conditions (e.g., ion species, dose, kinetic energy) may be selected to tune the electrical and physical characteristics of the well 26.

The well 26 is positioned in a lateral direction between the well 28 and the well 30. A portion of the well 22 is positioned in a lateral direction as a finger 27 between the well 26 and the well 28, and a portion of the well 22 is positioned in a lateral direction as a finger 29 between the well 26 and the well 30. The well 26 adjoins the finger 27 of the well 22 along an interface 32, and the well 26 adjoins the finger 29 of the well 22 along an interface 33. The interfaces 32, 33 are positioned in a vertical direction between the deep well 20 and the top surface 11 of the semiconductor substrate 12.

A doped region 34 is positioned in the well 28 adjacent to the top surface 11 of the semiconductor substrate 12, a doped region 36 is positioned in the well 30 adjacent to the top surface 11 of the semiconductor substrate 12, and a doped region 38 is positioned in the well 26 adjacent to the top surface 11 of the semiconductor substrate 12. The doped regions 34, 36 may be doped to an opposite conductivity type from the wells 28, 30, and the doped region 38 may be doped to have the same conductivity type as the well 26. In an embodiment, the doped regions 34, 36, 38 may be doped (e.g., heavily doped) with a concentration of an n-type dopant (e.g., arsenic or phosphorus) to provide n-type conductivity. The doped regions 34, 36, 38 may be concurrently formed by selectively implanting ions, such as ions including the n-type dopant, with an implantation mask having openings defining the intended locations for the doped regions 34, 36, 38 in the semiconductor substrate 12.

Doped regions 40, 42 of the same conductivity type are positioned adjacent to the top surface 11 of the semiconductor substrate 12. The doped region 40 and the doped region 42 may be doped to have the same conductivity type as the wells 28, 30 but at a higher dopant concentration. In an embodiment, the doped regions 40, 42 may be doped (e.g., heavily doped) with a concentration of a p-type dopant (e.g., boron) to provide p-type conductivity. The doped regions 40, 42 may be concurrently formed by selectively implanting ions, such as ions including the p-type dopant, with an implantation mask having openings defining the intended locations for the doped regions 40, 42 in the semiconductor substrate 12.

Doped regions 44, 46 are positioned adjacent to the top surface 11 of the semiconductor substrate 12. The doped regions 44, 46 are segmented with sections 48 having one conductivity type and sections 50 that have an opposite conductivity type to the sections 48. The sections 48 longitudinally alternate with the sections 50 along the length of the doped region 44 and, similarly, the sections 48 longitudinally alternate with the sections 50 along the length of the doped region 46. In an embodiment, the sections 48 may have the same conductivity type as the well 22, and the sections 48 may have an opposite conductivity type from the well 26 and the doped region 38. In an embodiment, the sections 50 may have an opposite conductivity type from the well 22, and the sections 50 may have the same conductivity type as the well 26 and the doped region 38. In an embodiment, the sections 48 may be doped with a concentration of a p-type dopant (e.g., boron) to provide p-type conductivity, and the sections 50 may be doped with a concentration of an n-type dopant (e.g., arsenic or phosphorus) to provide n-type conductivity. The sections 48 may be doped to have a higher dopant concentration than the well 22. The sections 50 may be doped to have a higher dopant concentration than the well 26.

The sections 48 may be formed by masked ion implantation concurrently with the formation of the doped regions 40, 42, and the sections 50 may be formed by masked ion implantation concurrently with formation of the doped regions 34, 36, 38. Portions of the well 22, which are masked during the implantations, are positioned in a longitudinal direction between each adjacent pair of the sections 48 and sections 50 such that the sections 48 and the sections 50 have a spaced-apart arrangement and such that adjacent pairs of the sections 48 and sections 50 do not adjoin.

The doped region 44 is positioned in lateral direction between the shallow trench isolation region 15 and the shallow trench isolation region 16. In an embodiment, the doped region 44 may adjoin each of the shallow trench isolation regions 15, 16. The shallow trench isolation region 15 is positioned between the doped region 34 and the doped region 44, and the shallow trench isolation region 16 is positioned between the doped region 38 and the doped region 44. The doped region 44 extends laterally across (i.e., bridges) the p-n junction along the interface 32 between the finger 27 of the well 22 and the well 26. A portion of the doped region 44 is positioned in an upper portion of the finger 27 of the well 22 adjacent to the top surface 11, and a different portion of the doped region 44 is positioned in the well 26 adjacent to the top surface 11. As a result, the interface 32 is positioned in a vertical direction between the deep well 20 and the doped region 44.

The doped region 46 is positioned in a lateral direction between the shallow trench isolation region 17 and the shallow trench isolation region 18. In an embodiment, the doped region 46 may adjoin each of the shallow trench isolation regions 17, 18. The shallow trench isolation region 17 is positioned between the doped region 38 and the doped region 46, and the shallow trench isolation region 18 is positioned between the doped region 36 and the doped region 46. The doped region 46 extends laterally across (i.e., bridges) the p-n junction along the interface 33 between the finger 29 of the well 22 and the well 26. A portion of the doped region 46 is positioned inside an upper portion of the finger 29 of the well 22 adjacent to the top surface 11, and a different portion of the doped region 46 is positioned inside the well 26 adjacent to the top surface 11. As a result, the interface 33 is positioned in a vertical direction between the deep well 20 and the doped region 46.

In an alternative embodiment, the doped regions 44, 46 may lack segmentation and instead be uniform with a single continuous conductivity type. For example, the non-segmented doped regions 44, 46 may have the same conductivity type as the well 22 and an opposite conductivity type from the well 26.

Middle-of-line processing and back-end-of-line processing follow, which includes formation of an interconnect structure 24 with electrical connections coupled to the silicon-controlled rectifier. The doped region 38 and the doped regions 44, 46 are not coupled to electrical connections in the interconnect structure 24 and, for that reason, are configured to be electrically floating.

The structure 10 may embody a fully-isolated symmetrical bidirectional device structure for a silicon-controlled rectifier that is suitable for use as electrostatic discharge protection device. The doped regions 34, 40 may be coupled together by an electrical connection 53 in the interconnect structure 24 to define a terminal 52 of the structure 10, and the doped regions 36, 42 may be coupled together by an electrical connection 55 in the interconnect structure 24 to define another terminal 54 of the structure 10. The terminals 52, 54 provide an anode and a cathode of the silicon-controlled rectifier.

In use, the structure 10 may be characterized by a current path when triggered by the occurrence of an electrostatic discharge event that is received at the terminal 52. The current of the electrostatic discharge event may be directed to the terminal 54 in a NPNP current path from the doped region 34 of the terminal 52 through the well 28, the deep well 20, and the well 30 to the doped region 42 of the terminal 54. Because the device structure is bi-directional, the structure 10 may alternatively be characterized by a current path when triggered by the occurrence of an electrostatic discharge event that is received at the terminal 54. The current of the electrostatic discharge event may be directed to the terminal 54 in an NPNP current path from the doped region 36 of the terminal 54 through the well 30, the deep well 20, and the well 28 to the doped region 40 of the terminal 52. The deep well 20 provides a deep current path independent of the terminal 52, 54 receiving the current from the electrostatic discharge event.

The doped region 38 and the doped regions 44, 46 are not connected to either of the terminals 52, 54 and are configured to be electrically floating. The floating doped region 38 may function to increase the holding voltage. The floating doped regions 44, 46 may function to reduce the avalanche breakdown voltage. The segmentation of the floating doped regions 44, 46 into the sections 48 and sections 50 of opposite conductivity type may also function to increase the holding voltage.

Figure 3:
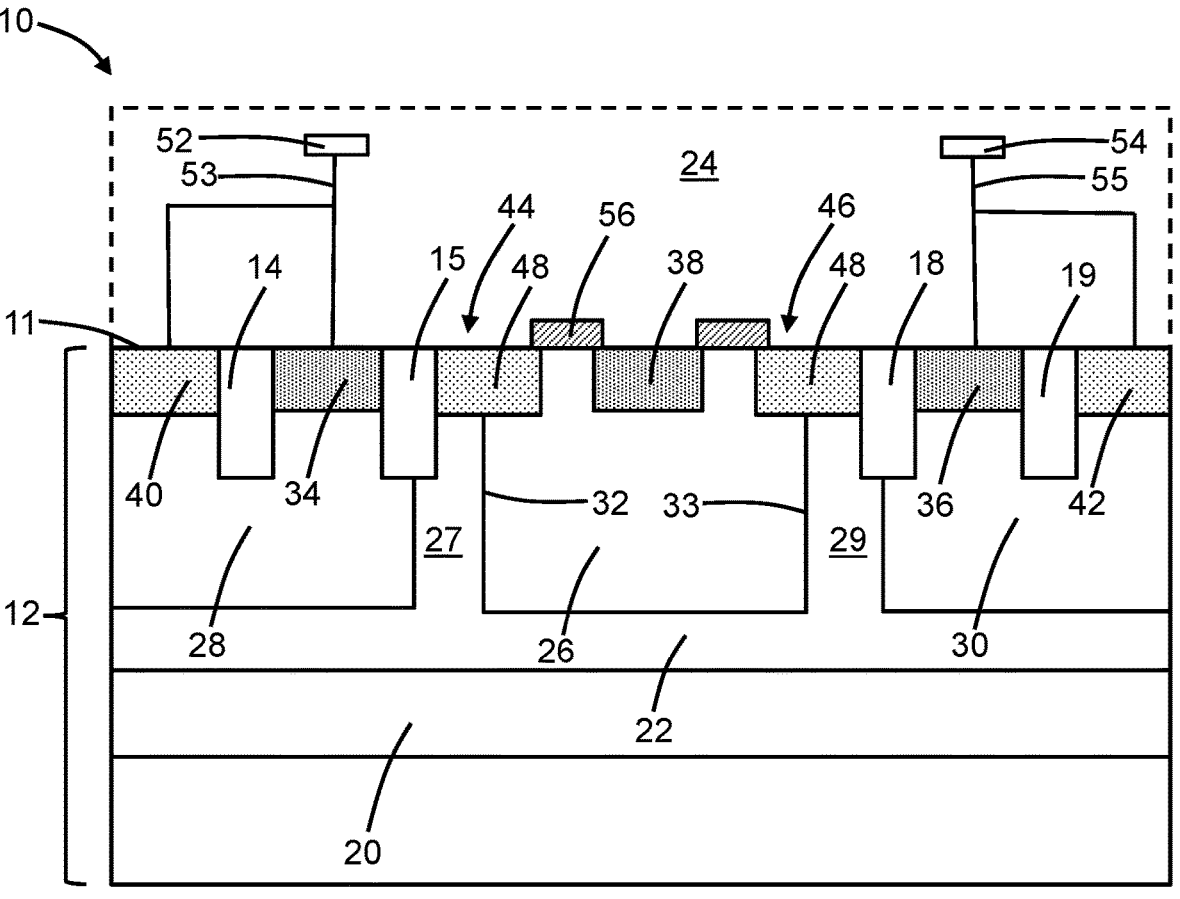
FIGS. 3, 3A are cross-sectional views of a structure in accordance with alternative embodiments of the invention.
Figure 3A:
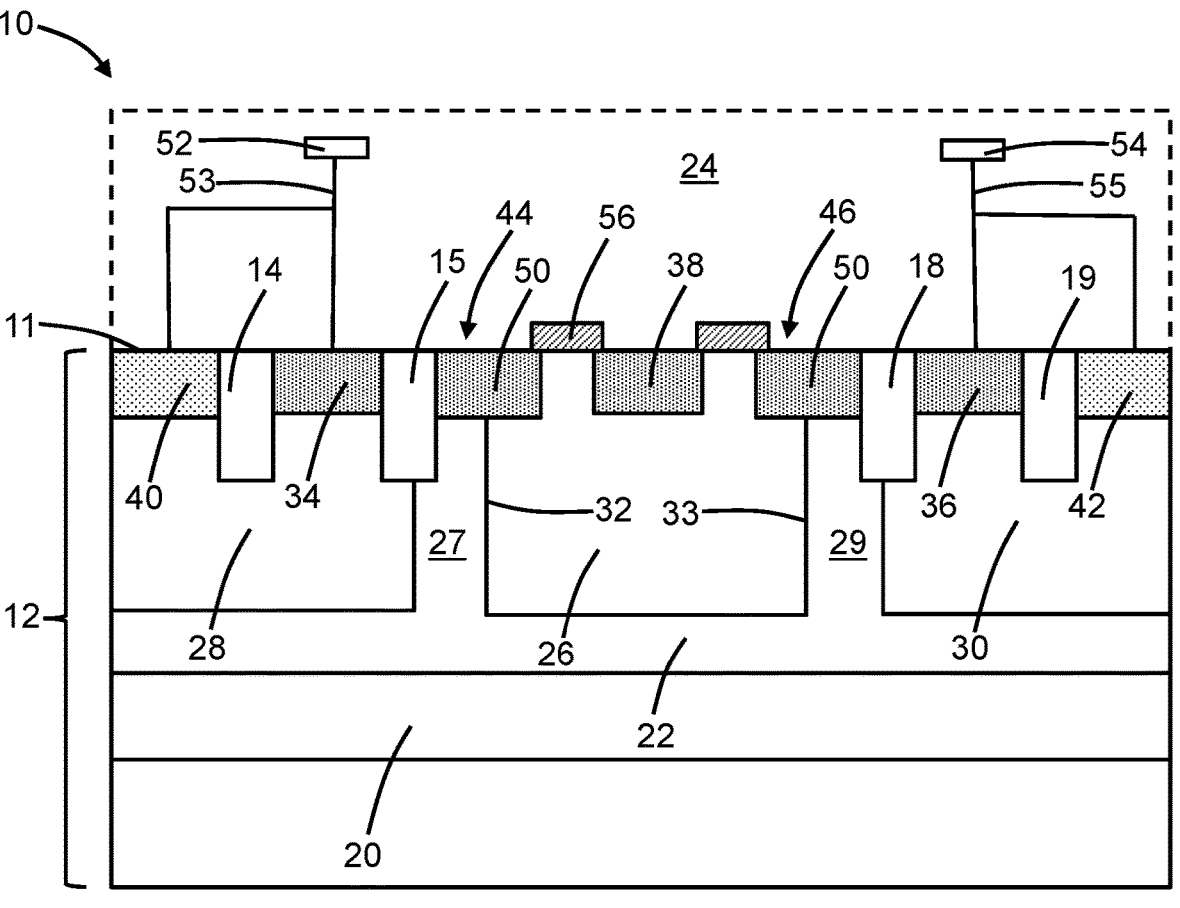

With reference to FIGS. 3A, 3B in which like reference numerals refer to like features in FIGS. 2, 2A and in accordance with alternative embodiments of the invention, a dielectric layer 56 may be formed as a silicide-blocking layer. The dielectric layer 56 may be comprised of, for example, silicon nitride that is deposited on the top surface 11 of the semiconductor substrate 12 and then patterned by lithography and etching processes to form sections. One section of the dielectric layer 56 has an overlapping relationship with a portion of the well 26 positioned in a lateral direction between the doped region 38 and the doped region 44, as well as an overlap with portions of the doped region 38 and the doped region 44 that are adjacent to the overlapped portion of the well 26. Another section of the dielectric layer 56 has an overlapping relationship with a portion of the well 26 positioned in a lateral direction between the doped region 38 and the doped region 46, as well as an overlap with portions of the doped region 38 and the doped region 46 that are adjacent to the overlapped portion of the well 26. The addition of the sections of the dielectric layer 56 may permit the elimination of the shallow trench isolation regions 16, 17.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:
a semiconductor substrate;
a first well in the semiconductor substrate, the first well having a first conductivity type;
a second well in the semiconductor substrate, the second well having the first conductivity type;
a third well in the semiconductor substrate, the third well having a second conductivity type opposite to the first conductivity type, and the third well positioned in a lateral direction between the first well and the second well;

a first terminal including a first doped region in the first well, the first doped region having the first conductivity type;
a second terminal including a second doped region in the second well, the second doped region having the second conductivity type;
a third doped region including a first portion in the third well, the third doped region including a first plurality of sections having the first conductivity type;
a fourth doped region including a first portion in the third well, the fourth doped region including a first plurality of sections having the first conductivity type;
a fifth doped region in the third well, the fifth doped region having the second conductivity type;
a first shallow trench isolation region in the semiconductor substrate, the first shallow trench isolation region positioned between the portion of the third doped region and the fifth doped region; and
a second shallow trench isolation region in the semiconductor substrate, the second shallow trench isolation region positioned between the portion of the fourth doped region and the fifth doped region.

2. The structure of claim 1 further comprising:
a fourth well in the semiconductor substrate, the fourth well having the first conductivity type, and the fourth well including a first finger between the first well and the third well.

3. The structure of claim 2 wherein the third doped region includes a second portion in the first finger of the fourth well.

4. The structure of claim 3 wherein the fourth well includes a second finger between the second well and the third well.

5. The structure of claim 4 wherein the fourth doped region includes a second portion in the second finger of the fourth well.

6. The structure of claim 2 wherein the fourth well has a lower dopant concentration than the first well or the second well.

7. The structure of claim 1 wherein the third doped region, the fourth doped region, and the fifth doped region are configured to be electrically floating.

8. The structure of claim 1 wherein the third doped region includes a second plurality of sections that longitudinally alternate in a first spaced-apart arrangement with the first plurality of sections, and the second plurality of sections have the second conductivity type.

9. The structure of claim 8 wherein the fourth doped region includes a second plurality of sections that longitudinally alternate in a second spaced-apart arrangement with the first plurality of sections of the fourth doped region, and the second plurality of sections of the fourth doped region have the second conductivity type.

10. The structure of claim 1 wherein the first conductivity type is p-type, and the second conductivity type is n-type.

11. The structure of claim 1 wherein the semiconductor substrate has a top surface, and further comprising:
a deep well in the semiconductor substrate, the deep well having the second conductivity type.

12. The structure of claim 11 wherein the third well is positioned in a vertical direction between the deep well and the top surface of the semiconductor substrate.

13. The structure of claim 11 further comprising:
a fourth well in the semiconductor substrate, the fourth well having the first conductivity type, the fourth well positioned in a vertical direction between the deep well and the first well, the fourth well positioned in the vertical direction between the deep well and the second well, and the fourth well having a lower dopant concentration than the first well or the second well.

14. The structure of claim 13 wherein the fourth well fully separates the deep well from the first well and the second well.

15. The structure of claim 11 wherein the first well is positioned in a vertical direction between the deep well and the top surface of the semiconductor substrate, and the second well is positioned in the vertical direction between the deep well and the top surface of the semiconductor substrate.

16. A method of forming a structure for a silicon-controlled rectifier, the method comprising:

forming a first well in a semiconductor substrate, wherein the first well has a first conductivity type;

forming a second well in the semiconductor substrate, wherein the second well has the first conductivity type;

forming a third well in the semiconductor substrate, wherein the third well having a second conductivity type opposite to the first conductivity type, and the third well is positioned in a lateral direction between the first well and the second well;

forming a first terminal including a first doped region in the first well, wherein the first doped region has the first conductivity type;

forming a second terminal including a second doped region in the second well, wherein the second doped region has the second conductivity type;

forming a third doped region including a portion in the third well, wherein the third doped region includes a first plurality of sections having the first conductivity type;

forming a fourth doped region including a portion in the third well, wherein the fourth doped region includes a first plurality of sections having the first conductivity type;

forming a fifth doped region in the third well, wherein the fifth doped region has the second conductivity type;

forming a first shallow trench isolation region in the semiconductor substrate, wherein the first shallow trench isolation region is positioned between the portion of the third doped region and the fifth doped region; and forming a second shallow trench isolation region in the semiconductor substrate, wherein the second shallow trench isolation region is positioned between the portion of the fourth doped region and the fifth doped region.

17. The method of claim 16 further comprising:

forming a deep well in the semiconductor substrate, wherein the deep well has the second conductivity type, the first well is positioned in a vertical direction between the deep well and a top surface of the semiconductor substrate, and the second well is positioned in the vertical direction between the deep well and the top surface of the semiconductor substrate.

* * * * *